United States Patent
Chung et al.

(10) Patent No.: US 7,118,969 B2
(45) Date of Patent: Oct. 10, 2006

(54) METHOD OF MANUFACTURING A FLOATING GATE AND METHOD OF MANUFACTURING A NON-VOLATILE SEMICONDUCTOR MEMORY DEVICE COMPRISING THE SAME

(75) Inventors: Jin-Kuk Chung, Yongin-si (KR); Chang-Rok Moon, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 104 days.

(21) Appl. No.: 10/787,968

(22) Filed: Feb. 27, 2004

(65) Prior Publication Data

US 2004/0171217 A1   Sep. 2, 2004

(30) Foreign Application Priority Data

Feb. 28, 2003   (KR) .................. 10-2003-0012764

(51) Int. Cl.
*H01L 21/336*   (2006.01)
(52) U.S. Cl. .............. 438/265; 438/257; 438/258; 438/259; 438/260; 438/261; 438/264; 438/266; 438/267; 438/301
(58) Field of Classification Search ........ 438/257–267, 438/283
See application file for complete search history.

(56) References Cited

U.S. PATENT DOCUMENTS

| 5,029,130 | A | | 7/1991 | Yeh | |
|---|---|---|---|---|---|
| 5,242,848 | A | * | 9/1993 | Yeh | ............... 438/266 |
| 5,480,819 | A | * | 1/1996 | Huang | ............ 438/263 |
| 5,917,214 | A | | 6/1999 | Sung | |
| 6,380,035 | B1 | * | 4/2002 | Sung et al. | ............... 438/264 |
| 6,424,002 | B1 | * | 7/2002 | Kondo et al. | ............... 257/316 |

FOREIGN PATENT DOCUMENTS

| JP | 11-26616 | 1/1999 |
|---|---|---|
| JP | 11-067936 | 3/1999 |
| KR | 2001-0091532 | 10/2001 |

\* cited by examiner

*Primary Examiner*—Michael Lebentritt
*Assistant Examiner*—Kyoung Lee
(74) *Attorney, Agent, or Firm*—Volentine Francos & Whitt, PLLC

(57) ABSTRACT

A method of manufacturing a floating gate provides an enhancement for the efficiencies of electron charge and injection. First, a conductive pattern, constituting the floating gate is formed on a substrate. A first insulation layer is formed on a sidewall of the conductive pattern, and then a second insulation layer is formed at an upper portion of the conductive pattern in ways that increase the sharpness of an edge portion where the sidewall and upper portions of the conductive pattern meet. Therefore, electron transference from the floating ate to a control gate is facilitated.

22 Claims, 14 Drawing Sheets

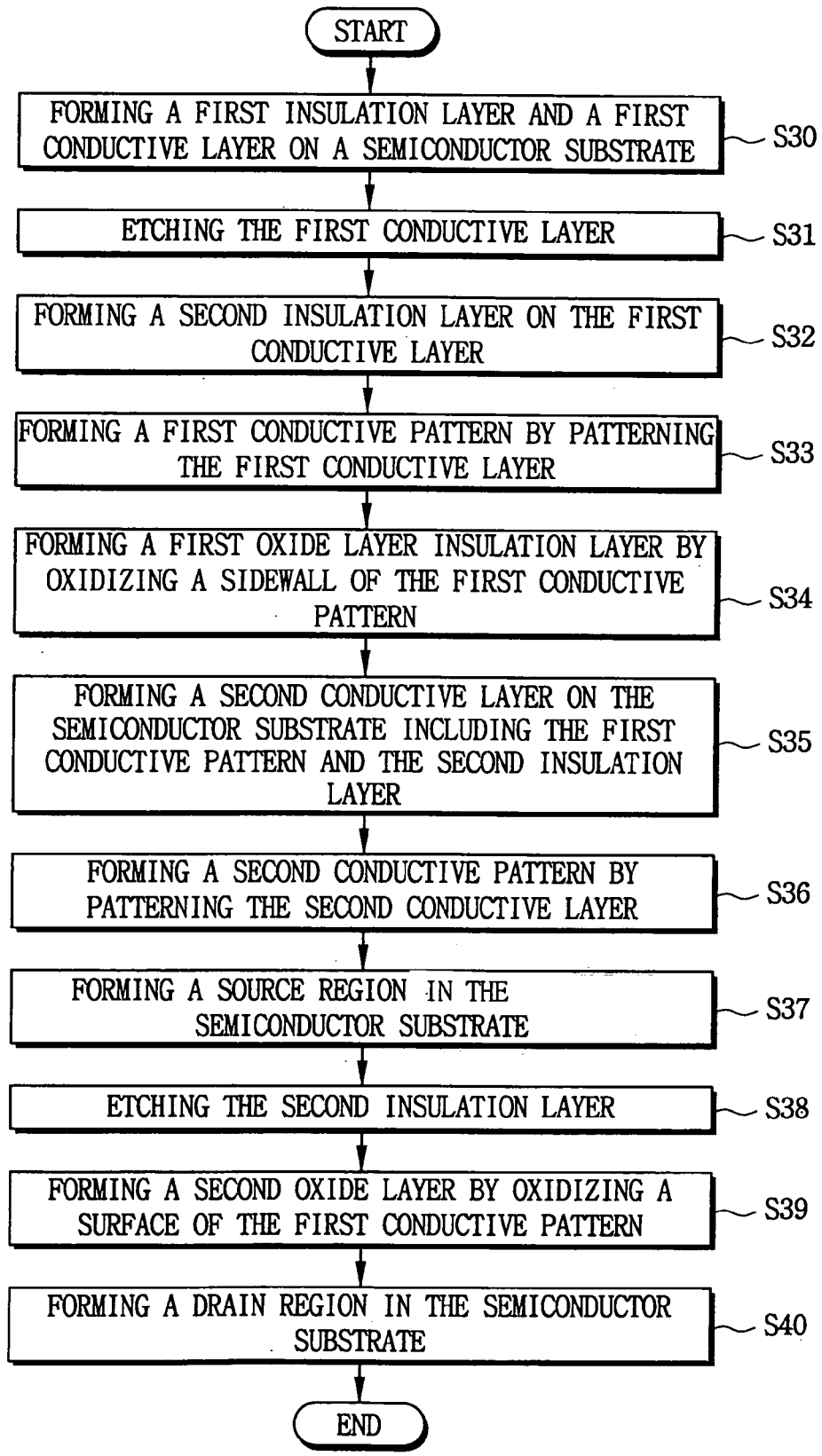

though only the sharpness of the edge at the upper portion of the floating gate is increased. Accordingly, the speed at which electrons can be transferred from the floating gate to the control gate is still rather limited.

METHOD OF MANUFACTURING A FLOATING GATE AND METHOD OF MANUFACTURING A NON-VOLATILE SEMICONDUCTOR MEMORY DEVICE COMPRISING THE SAME

BACKGROUND OF THE PRESENT INVENTION

1. Field of the Present Invention

The present invention relates to a method of forming a floating gate and to a method of manufacturing a non-volatile semiconductor memory device comprising a floating gate.

2. Description of the Related Art

Semiconductor memory devices are generally divided into volatile semiconductor memory devices and non-volatile semiconductor memory devices. In the volatile semiconductor memory device, data stored in the cell is dissipated when power is not applied. However, in the non-volatile semiconductor memory, stored data in the cell is retained even when power is not applied thereto. Because non-volatile semiconductor memory devices can store data for long periods of time, they are used to meet the current high demand for flash semiconductor memory devices such as EEPROMs (Electrically Erasable and Programmable Read Only Memories).

Meanwhile, flash semiconductor memory devices can be generally categorized as stacked flash semiconductor memory devices and spilt gate flash semiconductor memory devices. The split gate type of flash semiconductor memory device has a structure wherein a floating gate and a control gate are separated from each other, and the floating gate is electrically insulated from the outside. Information is stored in a memory cell of the split gate type of flash semiconductor memory device using the principle that current in a memory cell changes depending on electron injection (programming)/electron discharge (erasing) into/from the floating gate. In the electron injection, hot electrons are injected into the floating gate by a channel hot electron injection (CHEI) mechanism. The electron discharge is accomplished by Fowler-Nordheim (F-N) tunneling through a tunnel insulation layer between the floating gate and the control gate of the split gate type of flash semiconductor memory device. In connection with the electron injection (programming) and electron discharge (erasing), a voltage distribution may be explained as an equivalent capacitor model. Recently, the split gate type of flash semiconductor memory device has been widely used for the purpose of storing data.

The efficiency of the split gate type of flash semiconductor memory device required depends on the ease in which electrons can be transferred from the floating gate to the control gate. Therefore, various research into the structure of the floating gate aims at improving the efficiency of electron transference in the hope of realizing a floating gate having a small cell and, in turn, a non-volatile semiconductor memory device having lower power consumption, and an excellent ability to be integrated with a logic device.

For example, U.S. Pat. No. 5,029,130 discloses a method of manufacturing a floating gate capable of promoting the transference of electrons from the floating gate to a control gate. The method entails oxidizing an upper portion of the floating gate to increase the sharpness of the edge of the floating gate. However, the sharpness is increased only at the upper portion of the floating gate. Accordingly, the speed at which electrons can be transferred from the floating gate to the control gate is still rather limited.

Korean Laid-Open Patent Publication No. 2001-91532 discloses a method of manufacturing a split gate type of flash semiconductor memory device in which a gate oxide is formed on a silicon substrate, and then a polysilicon layer and a nitride layer are sequentially formed on the substrate including over the gate oxide. The nitride layer is selectively etched by a photolithographic process to form a nitride mask pattern. Then, an oxide layer is formed on the polysilicon layer. The polysilicon layer and the nitride mask pattern are removed by etching to leave a portion of the polysilicon layer beneath the oxide layer. After an interpoly tunnel insulation layer is formed, a control gate is formed on the oxide layer, the interpoly tunnel insulation layer and the gate oxide. Impurities are implanted between the polysilicon layer and the oxide layer to form source/drain regions, whereby the split gate type flash semiconductor memory device is completed. According to the above-mentioned publication, the split gate flash semiconductor memory device has enhanced programming and erasing efficiencies and improved endurance in terms of its programmability and erasability.

Meanwhile, Japanese Laid-Open Patent Publication No. 1999-26616 discloses a split gate type of memory device including an insulation layer for a floating gate formed on a semiconductor substrate, an insulation layer on the floating gate, a sidewall silicon oxide layer covering the sidewall of the floating gate, and a control gate insulated from the floating gate by the insulation layer and the sidewall silicon oxide layer. In this split gate type of memory device, the floating gate comprises polysilicon, and a silicon oxide layer is substituted for at least a portion of the polysilicon near the sidewall of the floating gate electrode. According to the publication, data writing and holding characteristics of the split gate type of memory device are improved without causing variations in the threshold voltage at the control gate, and data from being excessively erased.

However, in the methods described above, additional processes are required for forming the insulation layer between the floating gate and the control gate, and the gates may not be precisely aligned. Therefore, problems still remain, such as excessive cell size and the difficulty of integrating the memory device with a logic device.

SUMMARY OF THE INVENTION

A feature of the present invention is to provide a method of forming a floating gate having enhanced electron discharging and injecting efficiencies.

Another feature of the present invention is to provide a method of manufacturing a non-volatile semiconductor memory device having a floating gate that is accurately aligned with a control gate.

In accordance with one aspect of the present invention, an edge portion of a conductive pattern, constituting a floating gate, is provided with a high degree of sharpness. To this end, first, a conductive layer is formed on a semiconductor substrate. Next, the conductive layer is patterned using a photolithographic process to form a conductive a pattern on the semiconductor substrate. Then, a first insulation layer is formed on a sidewall of the conductive pattern in such a way that the sharpness of the edge portion of the conductive pattern is increased. Subsequently, a second insulation layer is formed at the upper portion of the conductive pattern so that the edge portion of the conductive pattern is even further increased.

In accordance with another aspect of the present invention, an underlying structure including a first conductive pattern is formed on a semiconductor substrate. A first insulation layer is formed on a sidewall of the first conductive pattern. Subsequently, a second conductive pattern that will serve as a control gate is formed on the first insulation layer. Preferably, the second conductive pattern is formed by etching conductive material using a dry etching process. Then, a second insulation layer is formed on the second conductive pattern.

In accordance with still another aspect of the present invention, a first insulation layer and a first conductive layer are sequentially formed on a semiconductor substrate. Then, the first conductive layer is etched to pattern the same in a first direction. A second insulation layer is formed on the etched first conductive layer. The first insulation layer and the etched first conductive layer are etched to pattern the same in a second direction and thereby form a first conductive pattern on the first insulation layer. A sidewall of the first conductive pattern is oxidized to form a first oxide layer on the sidewall of the conductive layer. A second conductive layer is formed on the semiconductor substrate including over the first conductive pattern and the second insulation layer. The second conductive layer is then patterned to form a second conductive pattern. Preferably, the patterning of the second conductive layer is performed using a dry etching process. Subsequently, a source region is formed in the semiconductor substrate adjacent the first conductive pattern. Then, the second insulation layer is etched away. An upper portion of the first conductive pattern is oxidized to form a second oxide layer. Finally, a drain region is formed in the semiconductor substrate adjacent the second conductive pattern.

According to the present invention, the sharp edge portion of the floating gate enhances the efficiencies of electron discharging and injecting. In addition, the alignment between the floating gate and the control gate is ensured by forming the control gate using a dry etching process. Furthermore, the split gate type of flash semiconductor memory device of the present invention can be produced with a higher degree of integration than a conventional flash semiconductor memory device whose cell size is 2-Tr. Still further, the split gate type of flash semiconductor memory device of the present invention, when used in a logic circuit, facilitates a high speed reading and writing of data without consuming a large amount of power.

BRIEF DESCRIPTION OF THE DRAWINGS

These and other objects, features and advantages of the present invention will become more readily apparent by referring to the following detailed description thereof made in conjunction with the accompanying drawings, wherein:

FIG. 6 is a flowchart illustrating still another embodiment of a method of manufacturing a non-volatile semiconductor memory device according to the present invention.

DETAILED DESCRIPTION OF THE PREFERRED EMBODIMENTS

Figure 1:
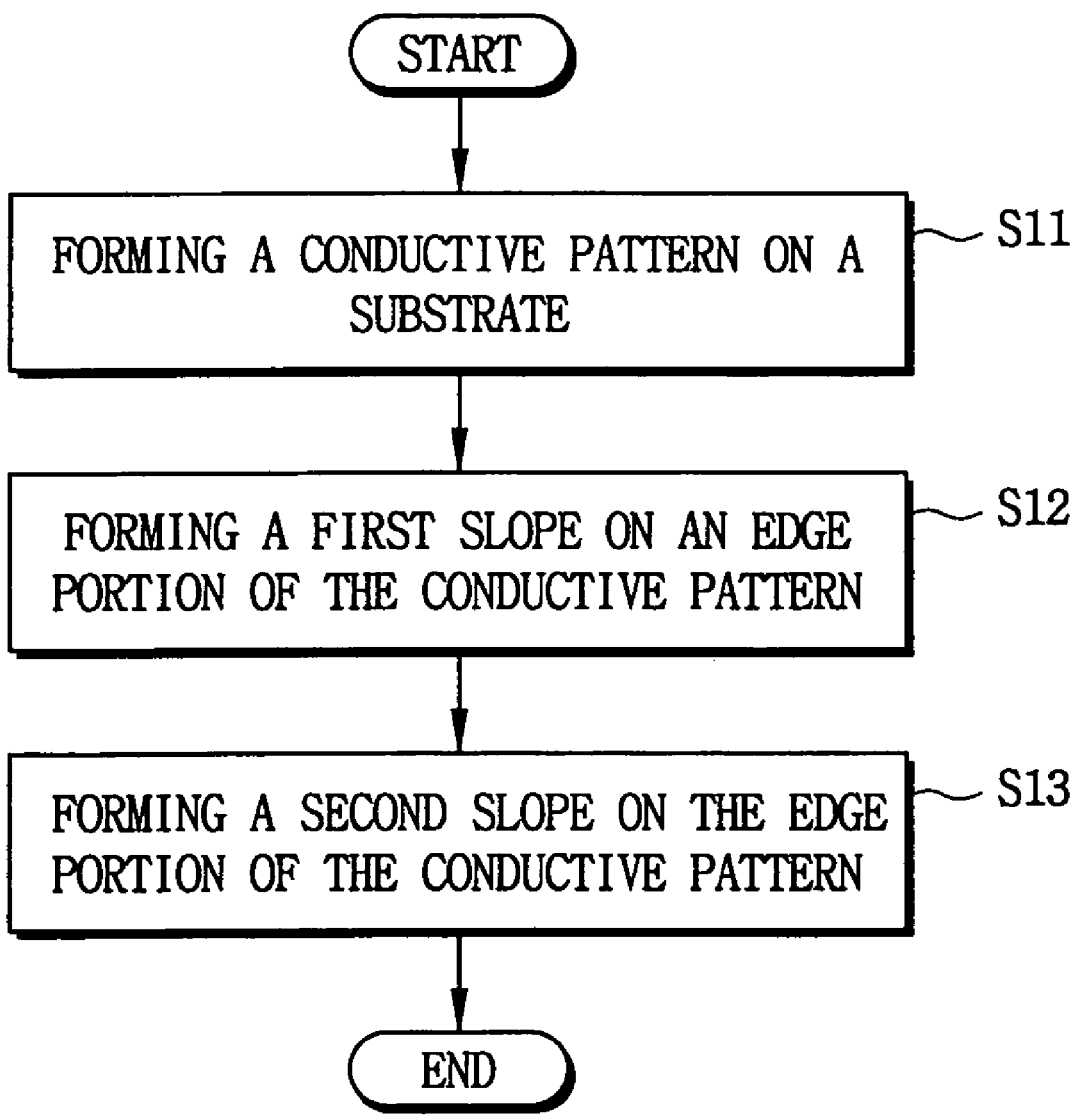
FIG. 1 is a flowchart illustrating one embodiment of a method of manufacturing a floating gate according to the present invention.

The present invention now will be described more fully hereinafter with reference to the accompanying drawings. Note, like reference numbers designate like elements throughout the drawings. Also, the relative thickness of layers may be exaggerated in the drawings for clarity in illustrating the present invention.

FIG. 1 outlines a first embodiment of a method of manufacturing a floating gate according to the present invention.

Referring to FIG. 1, a conductive layer of silicon (Si), e.g., amorphous silicon, polysilicon, or silicon doped with impurities, is formed on a semiconductor substrate (step S11). Then, the conductive layer is patterned using a photolithographic process to form a conductive pattern on the semiconductor substrate. Alternatively, the conductive layer may comprise a metal such as copper (Cu), tungsten (W), aluminum (Al), titanium (Ti), and the like.

Next, a first insulation layer is formed on a sidewall of the conductive pattern so that an edge portion of the conductive pattern has a first sharpness (step S12). More specifically, the first insulation layer is formed by oxidizing the sidewall of the conductive pattern.

Then, a second insulation layer is formed at an upper portion the conductive pattern so that the edge portion of the conductive pattern becomes even sharper (step S13). The second insulation layer is also formed by oxidizing the conductive pattern but this time at the upper portion thereof.

Figure 2A:
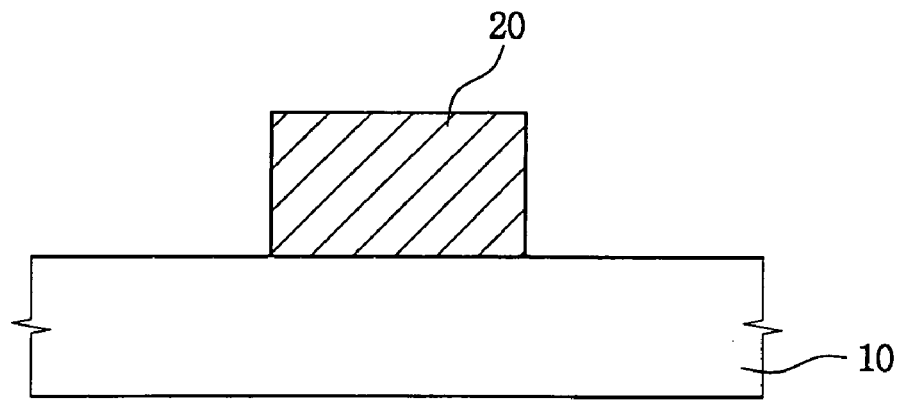
FIGS. 2A to 2C are cross-sectional views of a substrate, illustrating the method of forming the floating gate of a non-volatile semiconductor memory device according to the embodiment shown in FIG. 1.
Figure 2B:
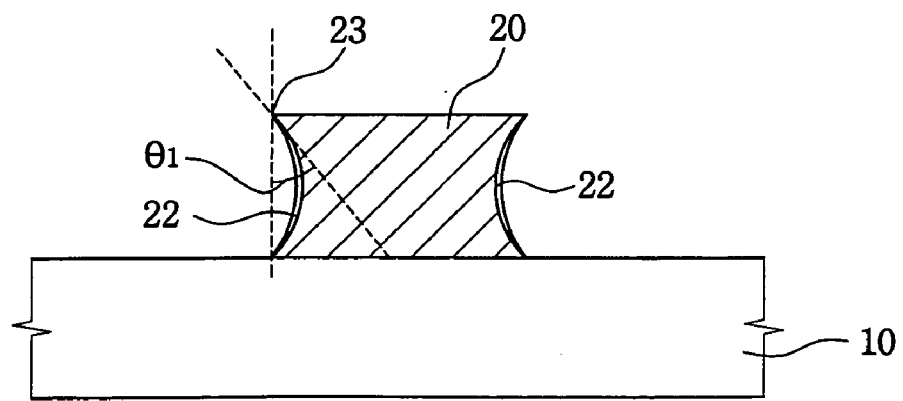
Figure 2C:
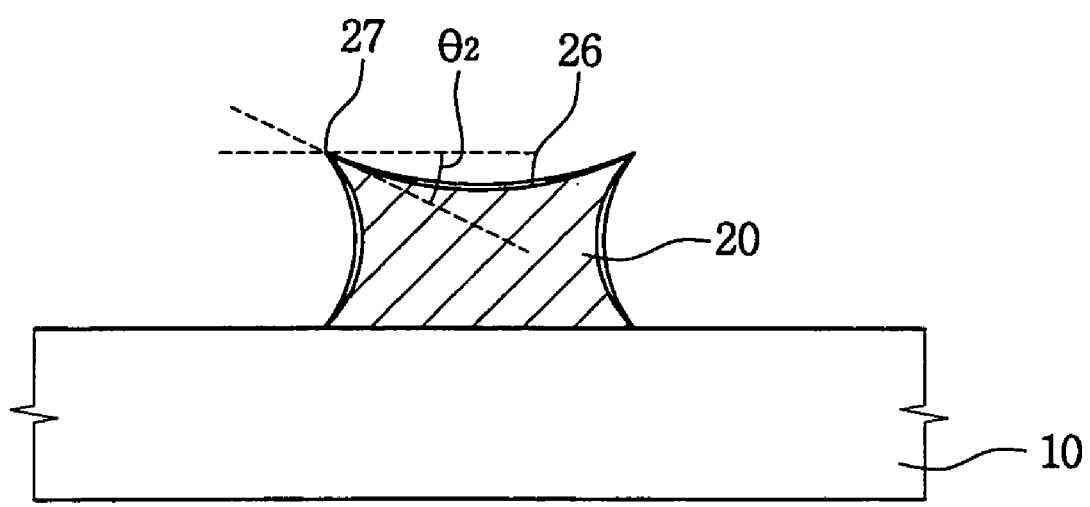

FIGS. 2A to 2C illustrate, in detail, the first embodiment of a method of forming a floating gate of a non-volatile semiconductor memory device according to the present invention.

Referring to FIG. 2A, a conductive layer is formed on a semiconductor substrate 10. The conductive layer is patterned by a photolithographic process to form a conductive pattern 20 on the semiconductor substrate 10. The conductive pattern 20 constitutes an underlying structure such as an electrode, a plug, a bit line or a word line. Preferably, however, the conductive pattern 20 constitutes a floating gate of a flash semiconductor memory device.

When the conductive pattern 20 constitutes the floating gate of a flash semiconductor memory device, the conductive pattern 20 is formed of amorphous silicon, polysilicon or silicon doped with impurities by a low pressure chemical vapor deposition (LPCVD) process. When the conductive pattern 20 is formed using polysilicon, the conductive pattern 20 may have a polycide structure in which a metal silicide film is formed on a polysilicon film. Alternatively, when the conductive pattern 20 is formed using polysilicon or amorphous silicon, the conductive pattern 20 may be doped with impurities by a $PCl_3$ diffusion process, an ion implantation process, or an in-situ doping process.

Also, an insulation layer comprising an oxide or nitride layer may be formed on the semiconductor substrate 10 before the conductive pattern 20 is formed. Then, the conductive layer is formed on the insulation layer. In this case, the conductive layer is formed on the semiconductor substrate 10 by a chemical vapor deposition (CVD) process, a physical vapor deposition (PVD) process or a sputtering process. The conductive layer is patterned to form the conductive pattern 20 on the insulation layer.

Referring to FIG. 2B, a first insulation layer 22 is formed on a sidewall of the conductive pattern 20 by oxidizing only the sidewall of the conductive pattern 20. As a result, the edge portion 23 of the conductive pattern 20 becomes cuspate, subtending a first angle Θ1 with a vertical axis (an axis perpendicular to substrate 10). That is, the sidewall of the conductive pattern 20 becomes concave, whereby the edge portion 23 of the conductive pattern 20 becomes more pointed, in accordance with the formation of the first insulation layer 22 on the sidewall of the conductive pattern 20.

In the present embodiment, the first insulation layer 22 is formed on the sidewall of the conductive pattern 20 by merely oxidizing the sidewall of the conductive pattern 20, i.e., without an additional process such as a CVD process or a PVD process. More specifically, the first insulation layer 22 is formed by a simple thermal oxidation process or a local oxidation of silicon (LOCOS) process. As a result, the first insulation layer 22 is rounded to thereby form the cuspate edge portion 23 of the conductive pattern 20. The edge portion 23 thus has a first sharpness corresponding to the first angle Θ1.

Note, also, a nitride layer may be formed at an upper portion of the conductive pattern 20 as an oxidation blocking layer before the first insulation layer 22 is formed on the sidewall of the conductive pattern 20.

Referring to FIG. 2C, a second insulation layer 26 is formed at the upper portion of the conductive pattern 20 by oxidizing the upper portion of the conductive pattern 20. The oxidizing process forms a concavity in the upper portion of the conductive pattern 20 such that the second insulation layer 26 has a slightly rounded shape. As a result, the edge portion of the conductive pattern 20 becomes even more cuspate, as designated by reference numeral 27, subtending a second angle Θ2 with a horizontal axis (parallel to the substrate 10). That is, the edge portion 27 of the conductive pattern 20 attains a second sharpness greater than that of the first sharpness.

In the present embodiment, the second insulation layer 26 is formed at the upper portion of the conductive pattern 20 by a thermal oxidation process or an LOCOS process, i.e., without a complex additional process such as a CVD process or a PVD process.

Figure 3:
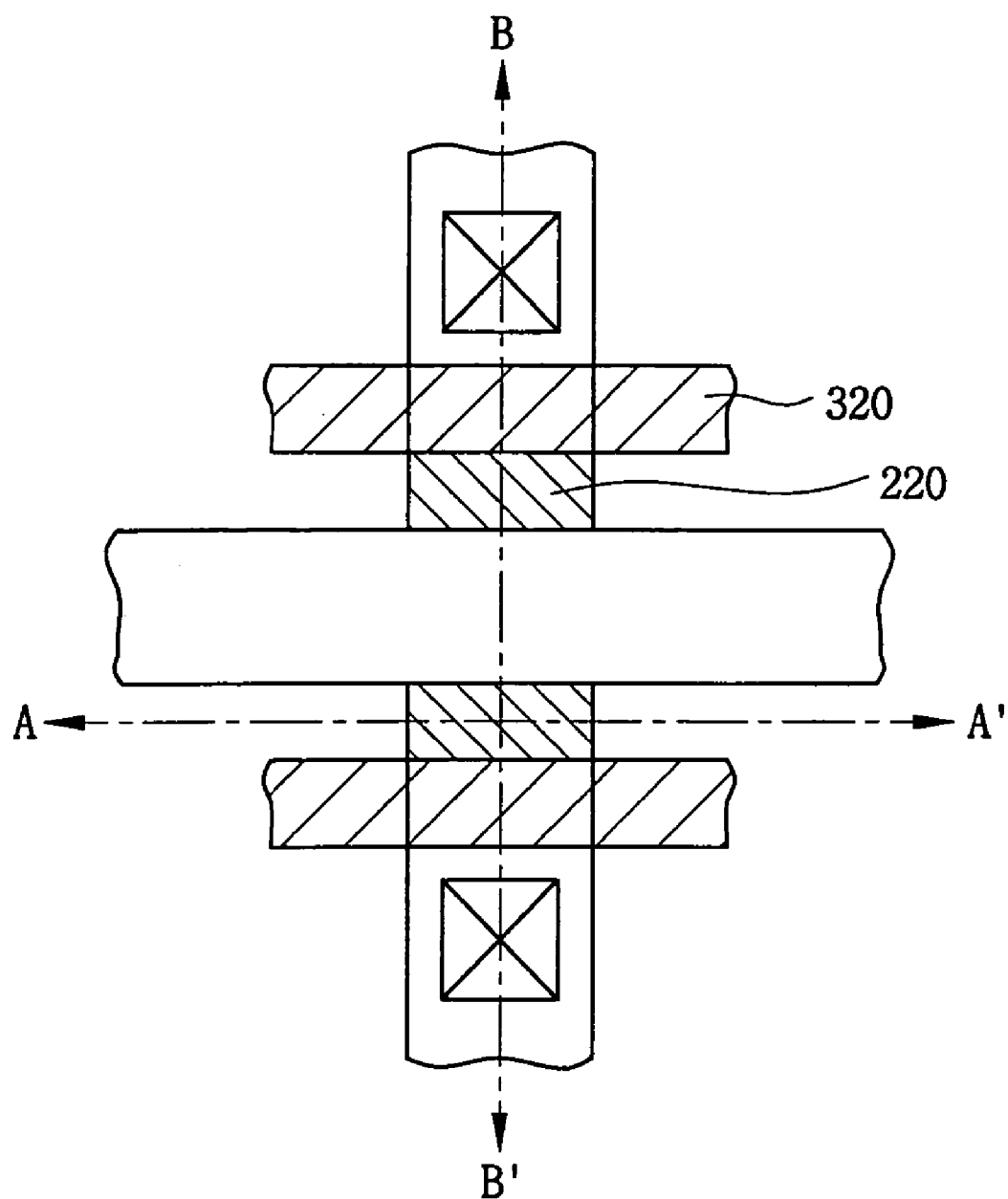
FIG. 3 is a plan view of a non-volatile semiconductor memory device according to the present invention.

Referring to FIG. 3, a non-volatile semiconductor memory device of the present invention includes an insulation region and active regions, and a floating gate 220 and a control gate 320 disposed on both sides of the insulation region. The direction A—A' in FIG. 3 across the floating gate 220 will hereinafter be referred to as the "first direction" while the direction B—B' across the active regions and the insulation region will be hereinafter referred to as the "second direction".

According to the present embodiment, both the upper portion and the sidewall of the floating gate are oxidized to form a sharp edge portion. Thus, the edge portion of the floating gate is much sharper than that of the conventional floating gate in which only the sidewall is oxidized. The sharper edge portion allows electrons to move more efficiently from the floating to a control gate. Accordingly, the characteristics of a non-volatile semiconductor memory device employing the floating gate of the present invention are enhanced.

Figure 4:
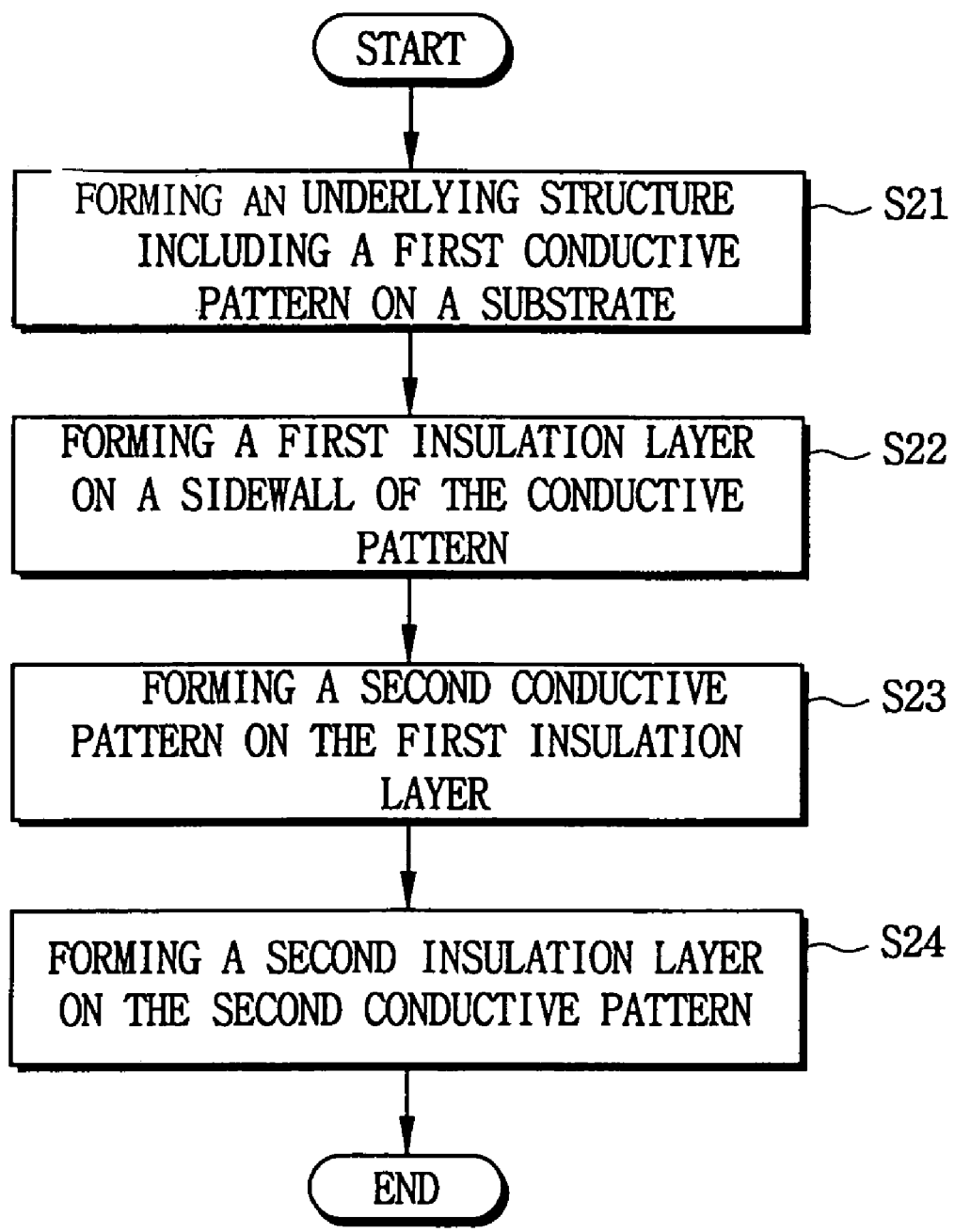
FIG. 4 is a flowchart illustrating another embodiment of a method of manufacturing a non-volatile semiconductor memory device according to the present invention.

FIG. 4 outlines a method of manufacturing a non-volatile semiconductor memory device according the present invention.

Referring to FIG. 4, an underlying structure, including a first conductive pattern, is formed on a semiconductor substrate (step S21). Then, a first insulation layer is formed on a sidewall of the conductive pattern (step S22).

Next, a second conductive pattern serving as a control gate is formed on the first insulation layer (step S23). Then, a second insulation layer is formed on the second conductive pattern (step S24).

FIGS. 5A to 5D illustrate in detail the method of manufacturing the non-volatile semiconductor memory device according to the present invention. FIGS. 5A to 5D are each a sectional view as taken along line B—B' in FIG. 3.

Figure 5A:
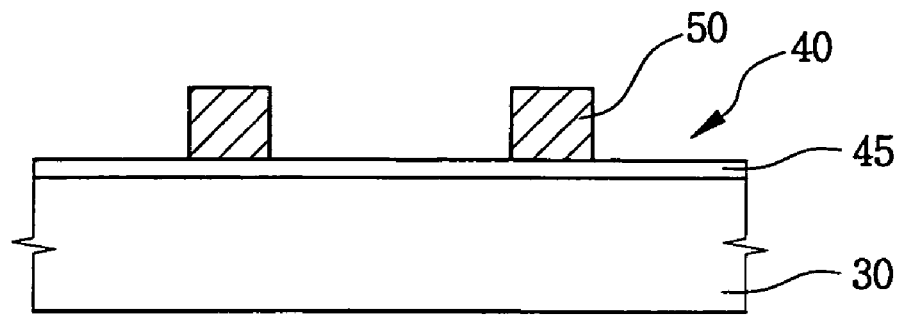
FIGS. 5A to 5D are cross-sectional views of a substrate, illustrating the method of forming the floating gate of a non-volatile semiconductor memory device according to the embodiment shown in FIG. 4.

Referring to FIGS. 3 and 5A, an underlying structure 40 including a first conductive pattern 50, which corresponds to a floating gate of the non-volatile semiconductor memory device, is formed on a substrate 30. Note, also, an underlying insulation layer 45 comprising an oxide or nitride layer may be formed between the substrate 30 and the first conductive pattern 50. In that case, the underlying insulation layer 45 is formed by a CVD process, a PVD process, or a sputtering process using an oxide, a nitride or oxynitride.

The first conductive pattern 50 is formed of amorphous silicon, polysilicon, silicon doped with impurities or polysilicon having a metal silicide formed thereon by an LPCVD process. The first conductive pattern 50 is produced by forming a first conductive layer (not shown) on the substrate 30, primarily etching the first conductive layer to pattern the same in the first direction, and by then secondarily etching first conductive layer to pattern the same in the second direction.

More specifically, after the first conductive layer is formed on the substrate 30, an oxide layer (not shown) or a nitride layer (not shown) is formed on the first conductive layer to define the active region. A photoresist pattern is formed on the oxide layer or the nitride layer, and then the first conductive layer is patterned in the first direction using a photolithographic process. The patterning of the first conductive layer in the first direction prevents the active region and the first conductive pattern corresponding to the floating gate from being misaligned. Subsequently, an insulation layer (not shown) is formed on the etched first conductive layer. Preferably, the insulation layer comprises nitride. After a photoresist pattern is formed on the insulation layer, the etched first conductive layer is patterned in the second direction using the photoresist pattern as an etching mask.

Figure 5B:
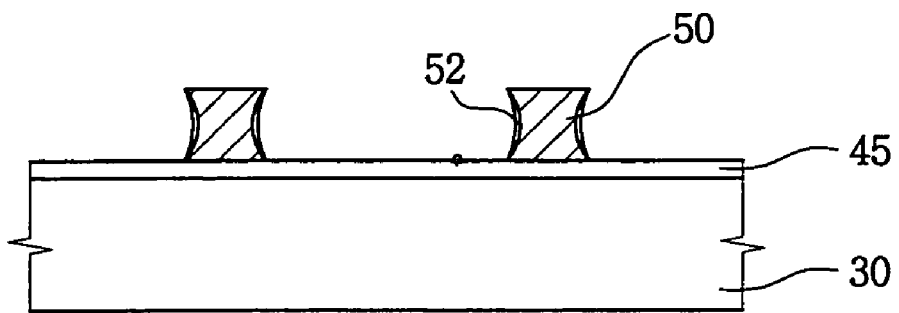

Referring to FIG. 5B, a first insulation layer 52 is formed on a sidewall of the first conductive pattern 50. The first insulation layer 52 is an oxide layer formed by oxidizing the sidewall of the first conductive pattern 50, i.e., without an additional process such as a CVD process or a PVD process. More specifically, the first insulation layer 52 is formed from the first conductive pattern 50 by a simple thermal oxidation process or a local oxidation of silicon (LOCOS) process. As a result, the first insulation layer 52 is rounded, i.e., is crescent-shaped. Accordingly, the sharpness of the edge portion of the first conductive pattern 50 is increased.

Figure 5C:
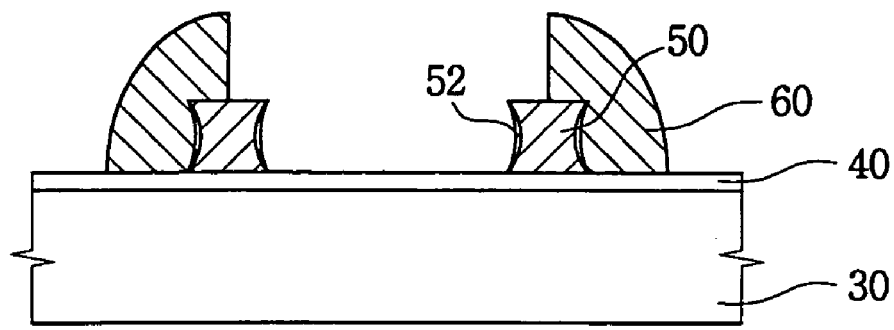

Referring to FIG. 5C, a second conductive pattern 60 corresponding to a control gate of the non-volatile semiconductor memory device is formed on the first insulation layer 52. The second conductive pattern 60 is formed of a layer of amorphous silicon, polysilicon, silicon doped with impurities or polysilicon having a metal silicide thereon. The layer is then anisotropically etched (dry etched) to pattern the same and thereby complete the forming of the second conductive pattern.

According to the present embodiment, the second conductive pattern 60 is formed in the shape of a spacer by an anisotropic dry etching process. To this end, a plasma etching process or a reactive ion etching (RIE) process may be used. Unlike a photolithographic process whose degree of resolution is limited, the dry etching process prevents a misalignment between the first conductive pattern 50 and the second conductive pattern 60, thereby ensuring that the non-volatile semiconductor memory deviceperforms well.

Figure 5D:
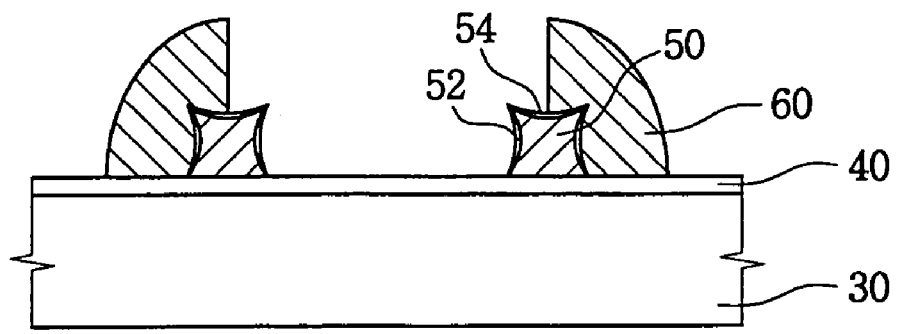

Referring to FIG. 5D, a second insulation layer 54 is formed on the first conductive pattern 50. The second insulation layer 54 is an oxide layer formed by oxidizing an upper portion of the first conductive pattern 50. In particular, the second insulation layer 54 is formed at the upper portion of the first conductive pattern 50 by a thermal oxidation process or an LOCOS process without a complex extra process such as a CVD process or a PVD process. Accordingly, the second insulation layer 54 is interposed between the first conductive pattern 50 and the second conductive pattern 60. As a result, the edge portion of the first conductive pattern 50 becomes even sharper.

In this embodiment as well, both the upper portion and the sidewall of the first conductive pattern 50 are oxidized to increase the sharpness at the edge portion thereof. When the non-volatile semiconductor memory device employs the first conductive pattern 50 as a floating gate, electrons migrate efficiently from the floating gate to the control gate.

In the embodiments described above, the second insulation layer 54 is formed at the upper portion of the first conductive pattern 50 by oxidizing the upper portion of the first conductive pattern 50, after the second conductive pattern 60 is formed. Alternatively, the second insulation layer 54 may be formed before the second conductive pattern 60 is formed on the first conductive pattern 50.

FIG. 6 outlines another method of manufacturing a non-volatile semiconductor memory device according to the present invention.

Referring to FIG. 6, a first insulation layer and a first conductive layer are formed sequentially on a semiconductor device (step S30). Then, the first conductive layer is etched so as to be patterned in the first direction (step S31). Subsequently, a second insulation layer is formed on the first conductive layer (step S32).

Next, the first insulation layer and the first conductive layer are etched so as to be patterned in the second direction to form a first conductive pattern on the first insulation layer (step S33). A sidewall of the first conductive pattern is oxidized to form a first oxide layer on the sidewall of the first conductive layer (step S34).

A second conductive layer is then formed on the semiconductor substrate including over the first conductive pattern and the second insulation layer (step S35). The second conductive layer is patterned to form a second conductive pattern (step S36). After the second conductive pattern is formed, a source region is formed in the semiconductor substrate adjacent the first conductive pattern (step S37).

Next, the second insulation layer is etched (step S38). Then, the upper portion of the first conductive pattern is oxidized to form a second oxide layer at the upper portion of the first conductive pattern (step S39). Subsequently a drain region is formed in the semiconductor substrate adjacent the second conductive pattern (step S40).

Figure 7A:
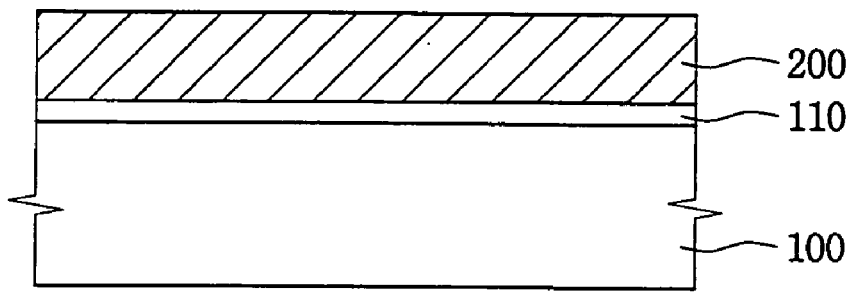
FIGS. 7A to 7K are cross-sectional views of a substrate, illustrating still another embodiment of a method of forming a non-volatile semiconductor memory device according to present invention.
Figure 7B:
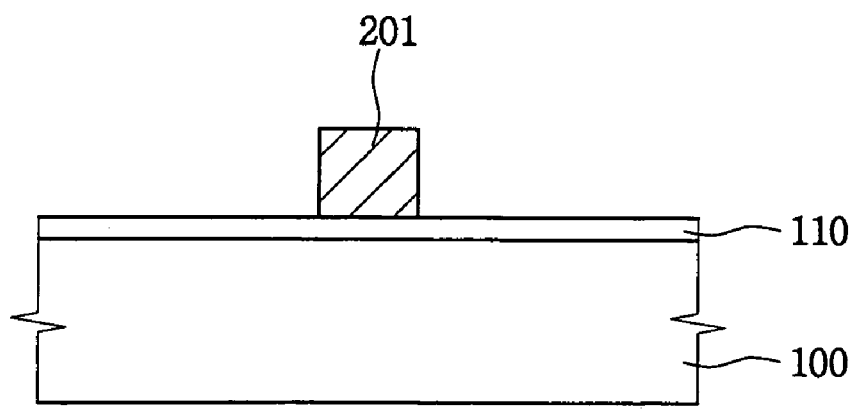
Figure 7C:
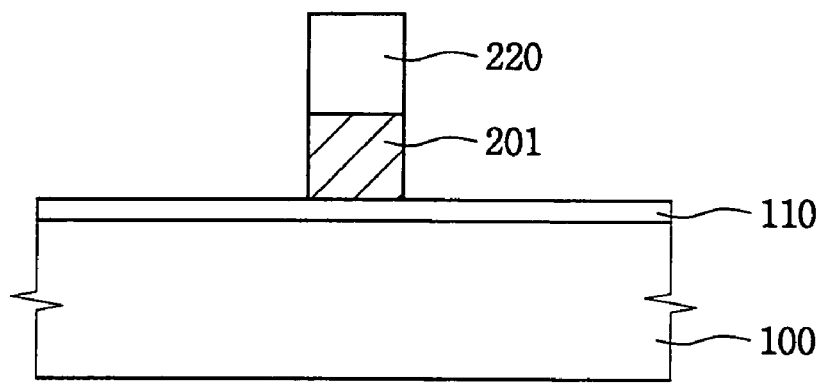

FIGS. 7A to 7K illustrate in more detail the method of forming the non-volatile semiconductor memory device as outlined above. More specifically, FIGS. 7A to 7C are cross-sectional views of the substrate taken in the first direction in FIG. 3, and FIGS. 7D to 7K are cross-sectional views of the substrate taken in the second direction in FIG. 3.

Referring to FIG. 7A, a first insulation 110 and a first conductive layer 200 are sequentially formed on a semiconductor substrate 100. The first insulation layer 110 is n oxide, nitride, or oxynitride layer, and the first conductive layer 200 comprises polysilicon, amorphous silicon, silicon doped with impurities, or polysilicon having a metal silicide thereon. The first conductor layer 200 is formed by a CVD process, a PVD process or a sputtering process.

Referring to FIG. 7B, the first conductive layer 200 is etched so as to be patterned in the first direction. In particular, an oxide layer (not shown) or a nitride layer (not shown) is formed on the first conductive layer 200. After a photoresist pattern is formed on the oxide layer or the nitride layer, the first conductive layer 200 is patterned in the first direction by a photolithographic process. This prevents misalignment in the first direction between the active region and the first conductive pattern 201 constituting the floating gate.

Referring to FIG. 3 and FIG. 7C, a second insulation 220 is formed on the first conductive pattern 201. Preferably, the second insulation layer 200 comprises a nitride, e.g., $Si_3N_4$, $SiN_x$, SiON. In particular, the second insulation layer 220 is formed by a CVD process, a plasma enhanced chemical vapor deposition (PECVD) process, a PVD process or a sputtering process.

Figure 7D:
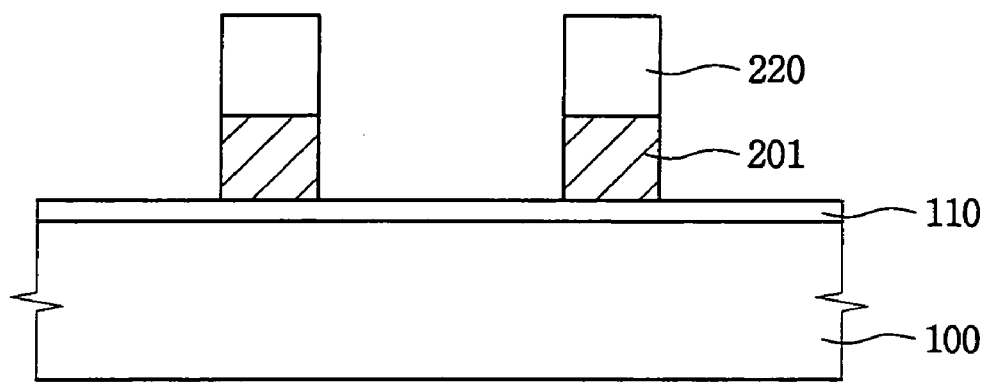

Referring to FIG. 7D, the first insulation layer 110 and the first conductive pattern 201 are secondarily etched so as to be patterned in the second direction. In particular, a photoresist pattern is formed on the second insulation layer 220, and the first conductive pattern 201 and second insulation layer 220 are etched using the photoresist pattern as a mask.

Figure 7E:
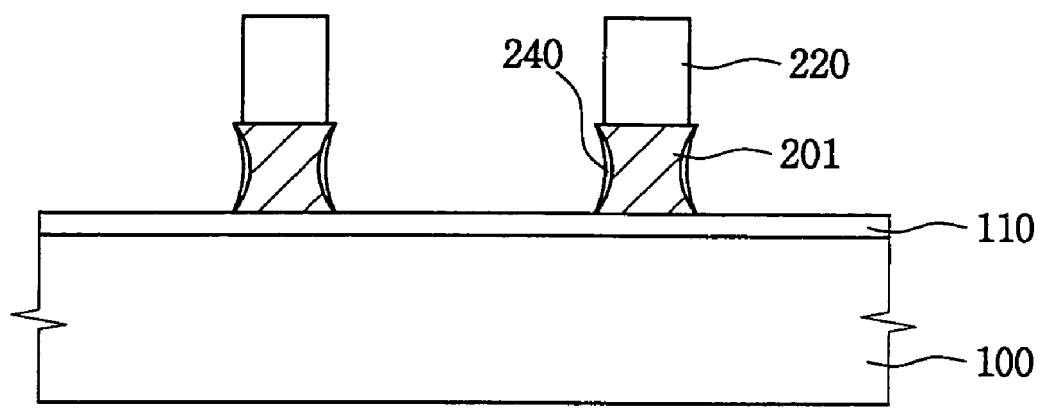

Referring to FIG. 7E, a sidewall of the first conductive pattern 201 is oxidized to form a first oxide layer 240 on the sidewall of the first conductive pattern 201. Accordingly, an edge portion of the first conductive pattern 201 has a slightly rounded shape at the sidewall of the first conductive pattern 201, whereby the sharpness of the edge portion is increased. And, as with the embodiments described above, the first oxide layer 240 is formed by merely oxidizing the sidewall of the first conductive pattern 201, i.e., without a complex additional process such as a CVD process or a PVD process. That is, the first oxide layer 240 is formed by a simple thermal oxidation process or an LOCOS process. Furthermore, the second insulation layer 220 functions as an anti-oxidant layer during the forming of the first oxide layer 240, preventing the upper portion of the first conductive pattern 201 from oxidizing while allowing only the sidewall of the first conductive pattern 201 to be oxidized.

Figure 7F:
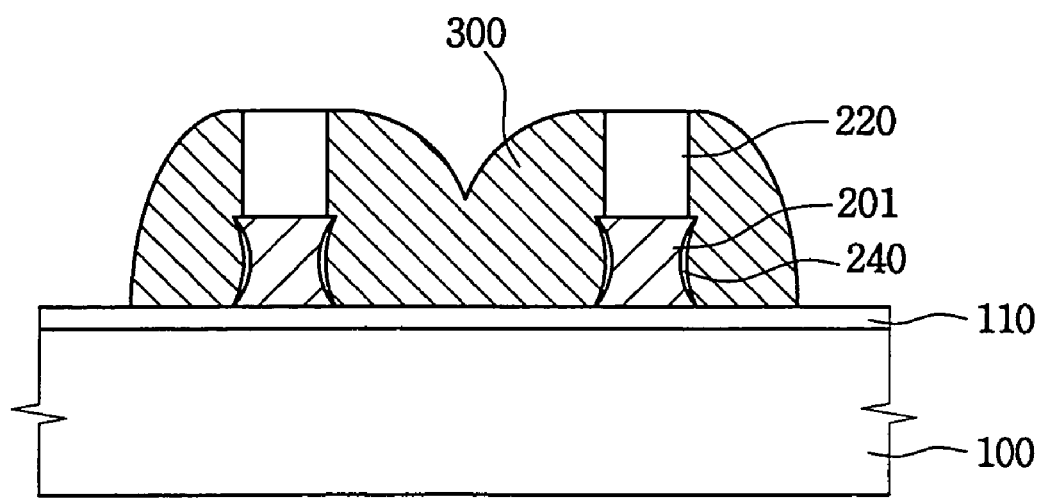

Referring to FIG. 7F, a second conductive layer 300 is formed on the semiconductor substrate 100 including over the first conductive pattern 201 and the second insulation layer 220. The second conductive layer 300 is advantageously formed by an LPCVD process and comprises polysilicon, amorphous silicon, silicon doped with impurities or polysilicon having a metal silicide thereon. The second conductive layer 300 is etched to form a control gate of the flash semiconductor memory device.

Figure 7G:
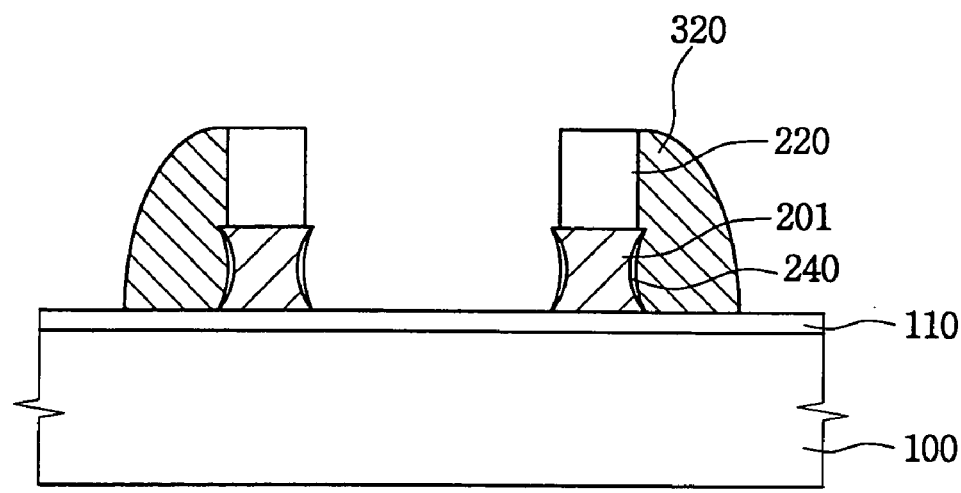

Referring to FIG. 7G, a second conductive pattern 320 is formed in the shape of a spacer by etching the second conductive layer 30. In particular, the second conductive pattern 320 is formed by an anisotropic dry etching process. To this end, a plasma etching process or a reactive ion etching (RIE) process may be used for forming the second conductive pattern 320. A misalignment between the first conductive pattern 201 and the second conductive pattern 320 is prevented because the second conductive pattern 320 is formed by an anisotropic dry etching process, and not by a photolithographic process whose degree of resolution is rather limited. In addition, the anisotropic dry etching process removes part of the second conductive layer 300 to facilitate the forming of a source region.

Figure 7H:
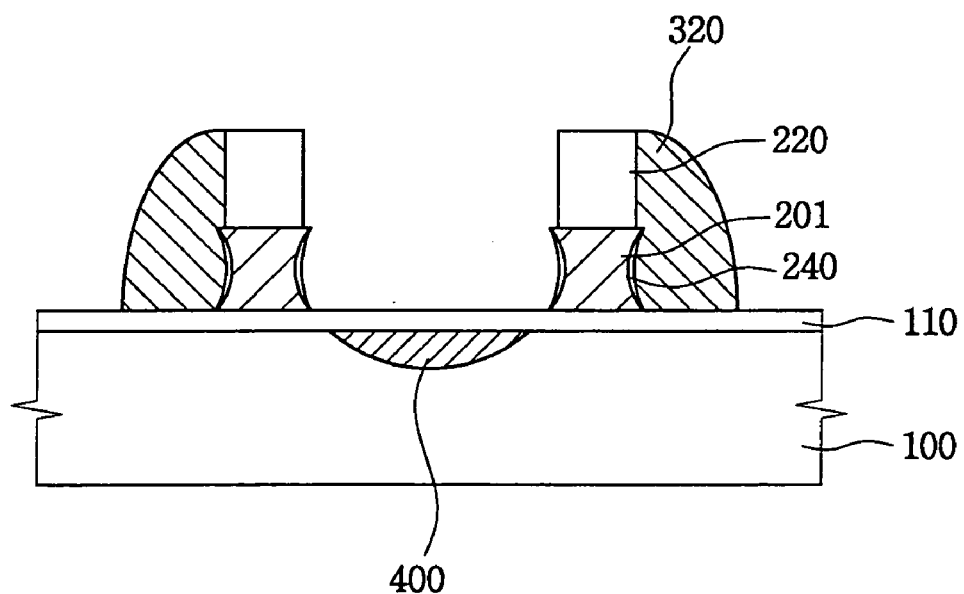

Referring to FIG. 7H, the source region 400 is formed in the semiconductor substrate 100 adjacent the first conductive pattern 201. The source region 400 is formed by doping impurities into the semiconductor substrate 100 using an ion implantation process.

Figure 7I:
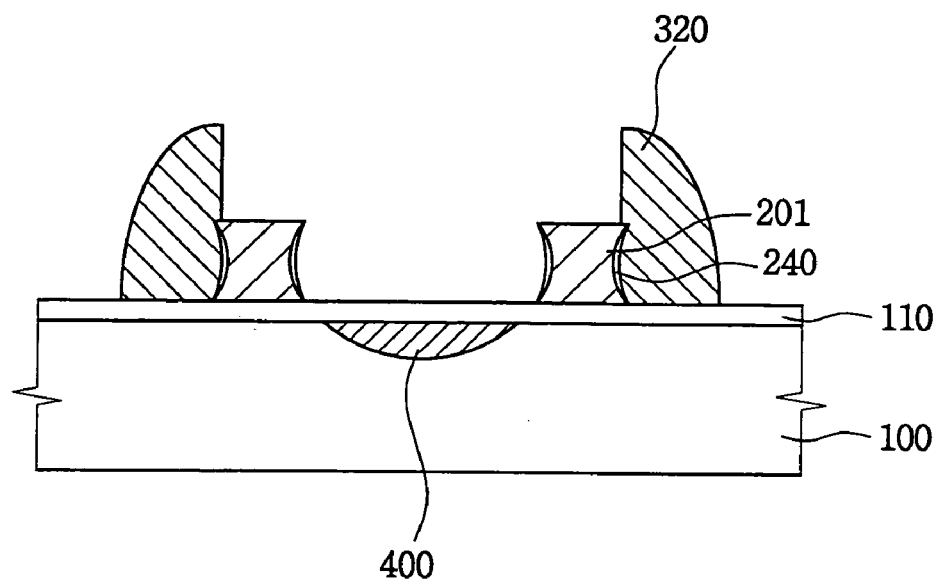

Referring to FIG. 7I, the second insulation layer 220 on the first conductive pattern 201 is removed. To this end, the second insulation layer 220 is treated with an etching solution containing phosphoric acid ($H_3PO_4$) at a temperature of about 180° C.

Figure 7J:
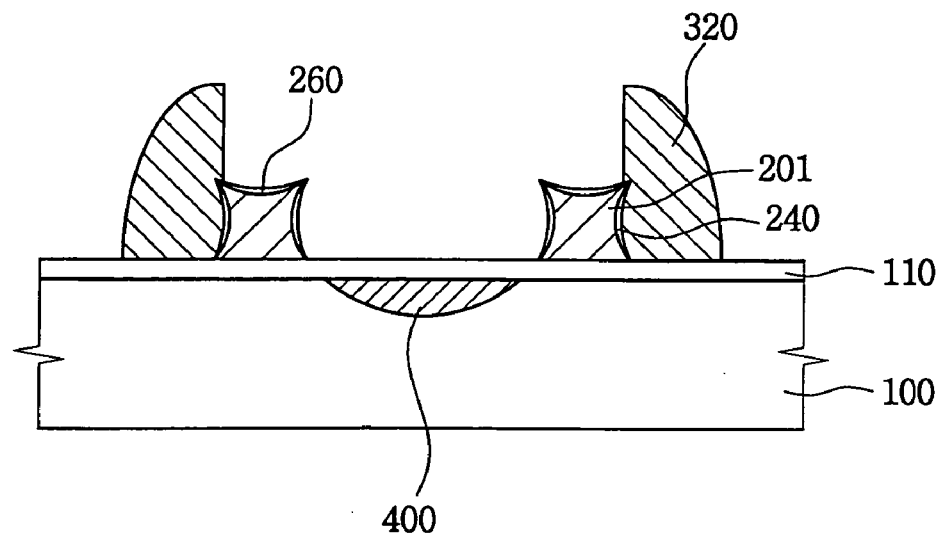

Referring to FIG. 7J, a second oxide layer 260 is formed by oxidizing the upper portion of the first conductive pattern 201. Accordingly, the edge portion of the first conductive pattern 201 becomes slightly rounded at the upper portion of the first conductive pattern 201, i.e., relative a horizontal direction or a direction parallel to the semiconductor substrate 100.

According to the present embodiment, both of the upper portion and the sidewall of the first conductive pattern 201 are oxidized to form a sharp edge portion where the sidewall and the upper portion of the first conductive pattern 210 meet. That is, the edge portion of the first conductive pattern 201 will be much sharper than that of the conventional floating gate. As a result, electrons will move more efficiently from the floating to the control gate, thereby significantly enhancing the characteristics of the non-volatile semiconductor memory device.

Figure 7K:
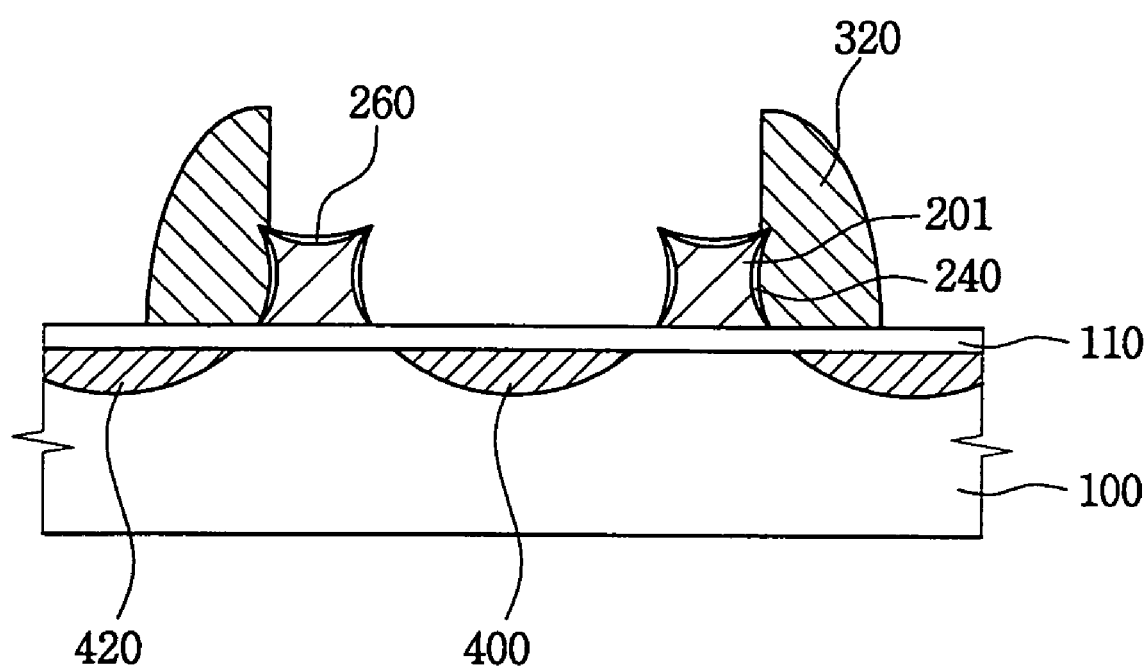

Referring to FIG. 7K, a drain region 420 is formed in the semiconductor substrate 100 adjacent the second conductive pattern 320. The drain region 420 is formed by implanting impurities into the semiconductor substrate 100 using an ion implantation process.

A wiring (not shown) and a drain contact (not shown) are formed at the upper portion of and adjacent the second conductive pattern 320 by a silicidation process and a metallization process to complete the flash semiconductor memory device.

Compared to the conventional non-volatile semiconductor memory device, such as a stacked type of flash semiconductor memory device, the split gate type of flash semiconductor memory device manufactured according to the method of the present invention is less prone to problems such as over-erasing and high power consumption in a data writing mode. Also, the split gate type of flash semiconductor memory device can be manufactured according to the present invention to have a lower integration density than a conventional flash semiconductor memory device having a cell size of 2-Tr. Furthermore, the split gate type of flash semiconductor memory device of the present invention can be readily integrated with a logic circuit to produce a device that can read and write of data, at a high speed and yet consume a relatively low amount of power in doing so.

Finally, although the present invention has been described in connection with the preferred embodiments thereof, the present invention is not so limited. Rather, various changes to and modifications of the preferred embodiments are seen to be within the true spirit and scope of the present invention as hereinafter claimed.

What is claimed is:

1. A method of manufacturing a floating gate, comprising:
    forming a conductive pattern on a substrate, wherein the conductive pattern has a sidewall, an upper portion, and an edge portion where the upper portion and sidewall meet;
    forming a first insulation layer on the sidewall of the conductive pattern in a way that sharpens the edge portion of the conductive pattern, whereby the edge portion has a first sharpness; and
    subsequently forming a second insulation layer on the upper portion of the conductive pattern in a way that further sharpens the edge portion, whereby the edge portion has a second sharpness greater than said first sharpness.

2. The method of claim 1, wherein said forming of the conductive pattern comprises forming a layer of polysilicon on the substrate.

3. The method of claim 1, wherein said forming of the conductive pattern comprises forming a layer of silicon on the substrate, and doping the silicon with impurities.

4. The method of claim 1, wherein said forming of the conductive pattern comprises forming a layer of polysilicon on the substrate, and forming a metal silicide on the polysilicon.

5. The method of claim 1, wherein said forming of the first insulation layer comprises forming an oxide layer on the sidewall of the conductive pattern.

6. The method of claim 5, wherein the first insulation layer is formed by oxidizing the conductive pattern.

7. The method of claim 1, wherein said forming of the second insulation layer comprises forming an oxide layer on the upper portion of the conductive pattern.

8. The method of claim 7, wherein the second insulation layer is formed by oxidizing the conductive pattern.

9. A method of manufacturing a non-volatile semiconductor memory device, comprising:
    forming a floating gate on a substrate, the floating gate comprising a first conductive pattern having a sidewall, an upper portion, and an edge portion where the upper portion and sidewall meet;
    forming a first insulation layer on the sidewall of the first conductive pattern;
    forming a control gate on the first insulation layer and the first conductive pattern, the control gate comprising a second conductive pattern; and
    subsequently forming a second insulation layer on the upper portion of the first conductive pattern so as to be located between the first conductive pattern and the second conductive pattern.

10. The method of claim 9, wherein said forming the first conductive pattern comprises:
    forming a conductive layer on the substrate,
    etching the conductive layer on the substrate to pattern the conductive layer in a first direction, and
    subsequently etching the conductive layer to pattern the conductive layer in a second direction perpendicular to the first direction.

11. The method of claim 10, wherein each said etching of the conductive layer is performed by a photolithographic process.

12. The method of claim 9, wherein said forming a floating gate comprises forming an underlying insulation layer on the substrate, and forming the first conductive pattern on the underlying insulation layer.

13. The method of claim 9, wherein said forming of the first insulation layer comprises forming an oxide layer on the sidewall of the first conductive pattern.

14. The method of claim 13, wherein the first insulation layer is formed by oxidizing the first conductive pattern.

15. The method of claim 9, wherein said forming the second conductive pattern comprises:
   forming a conductive layer on the first insulation layer and the first conductive pattern, and
   dry etching the conductive layer.

16. The method of claim 9, wherein said forming of the second insulation layer comprises forming an oxide layer on the upper portion of the first conductive pattern.

17. The method of claim 16, wherein the second insulation layer is formed by oxidizing the first conductive pattern.

18. A method of manufacturing a non-volatile semiconductor memory device, comprising:
   sequentially forming a first insulation layer and a first conductive layer on a substrate;
   etching the first conductive layer to pattern the first conductive layer in a first direction;
   forming a second insulation layer on the etched first conductive layer;
   forming a first conductive pattern by etching the first insulation layer and the etched first conductive layer so as to pattern the first insulation layer and the etched first conductive layer in a second direction;
   forming a first oxide layer by oxidizing a sidewall of the first conductive pattern;
   forming a second conductive layer on the substrate including over the first conductive pattern and the second insulation layer;
   forming a second conductive pattern by etching the second conductive layer;
   forming a source region in the substrate adjacent the first conductive pattern;
   etching the second insulation layer from atop the first conductive pattern;
   forming a second oxide layer by oxidizing an upper portion of the first conductive pattern; and
   forming a drain region in the substrate adjacent the second conductive pattern.

19. The method of claim 18, wherein said forming of the second conductive pattern comprises a dry etching process.

20. The method of claim 19, wherein said forming of the source region and the drain region comprises an ion implantation process.

21. The method of claim 6, wherein said forming of the conductive pattern comprises forming a layer comprising silicon on the substrate, and said forming of the first insulation layer comprises a local oxidation of silicon (LOCOS) process.

22. The method of claim 14, wherein said forming of the conductive pattern comprises forming a layer comprising silicon on the substrate, and said forming of the first insulation layer comprises a local oxidation of silicon (LOCOS) process.

* * * * *